US012385502B2

(12) United States Patent
Singh et al.

(10) Patent No.: US 12,385,502 B2
(45) Date of Patent: Aug. 12, 2025

(54) ACOUSTIC FAN CASING SYSTEM

(71) Applicant: Vertiv Corporation, Westerville, OH (US)

(72) Inventors: Balar Rampati Singh, Maharashtra (IN); Kishan Jaysukh-Bhai Jethva, Maharashtra (IN); Ajay Prakash Tenginkai, Maharashtra (IN)

(73) Assignee: VERTIV CORPORATION, Westerville, OH (US)

(*) Notice: Subject to any disclaimer, the term of this patent is extended or adjusted under 35 U.S.C. 154(b) by 0 days.

(21) Appl. No.: 18/669,171

(22) Filed: May 20, 2024

(65) Prior Publication Data

US 2024/0401612 A1   Dec. 5, 2024

(30) Foreign Application Priority Data

Jun. 1, 2023  (IN) .............................. 202311037771

(51) Int. Cl.
F04D 29/66    (2006.01)
F04D 19/00    (2006.01)
H05K 7/20     (2006.01)

(52) U.S. Cl.
CPC ......... F04D 29/664 (2013.01); F04D 19/002 (2013.01); H05K 7/20172 (2013.01); H05K 7/20727 (2013.01)

(58) Field of Classification Search
CPC .............................. F04D 29/664; F04D 19/002
See application file for complete search history.

(56) References Cited

U.S. PATENT DOCUMENTS

| 4,807,718 A * | 2/1989 | Lotz ......................... H02K 5/24 |
| | | 181/225 |
| 5,788,566 A * | 8/1998 | McAnally ................. G06F 1/20 |
| | | 415/213.1 |
| 5,917,698 A | 6/1999 | Viallet |
| 6,375,440 B2 * | 4/2002 | Kosugi ................. F04D 25/166 |
| | | 416/247 R |
| 6,547,516 B2 | 4/2003 | Liu |
| (Continued) | | |

FOREIGN PATENT DOCUMENTS

| DE | 4292333 T1 | 6/1994 | |
| EP | 1983211 A2 * | 10/2008 | .............. F16F 1/371 |

OTHER PUBLICATIONS

European Patent Office, Extended European Search Report received in EP Application No. 24179318.1, Oct. 29, 2024, 11 pages.

*Primary Examiner* — J. Todd Newton
(74) *Attorney, Agent, or Firm* — Suiter Swantz IP

(57) ABSTRACT

A fan acoustic casing system may include one or more casing sidewalls configured to at least partially define a cavity configured to receive the one or more fans. A casing sidewall may be configured to rotate between an open position or a closed position via a rotation mechanism, where one or more surfaces of the one or more casing sidewalls may be coupled to one or more acoustic insulation pads formed of one or more acoustic insulation materials to reduce vibrational noise. The system may include one or more sidewall fastening members configured to couple a casing sidewall to an additional casing sidewall. The system may include a mounting assembly including one or more mounting members configured to removably couple the fan casing assembly to a panel of a cabinet.

20 Claims, 18 Drawing Sheets

(56) References Cited

U.S. PATENT DOCUMENTS

| | | | | |
|---|---|---|---|---|
| 6,587,342 | B1* | 7/2003 | Hsu | G06F 1/20 |
| | | | | 415/213.1 |
| 7,048,498 | B2 | 5/2006 | Kosugi | |
| 7,824,155 | B2* | 11/2010 | Chen | F04D 29/601 |
| | | | | 415/213.1 |
| 8,206,103 | B2* | 6/2012 | Sun | G06F 1/20 |
| | | | | 415/213.1 |
| 9,008,534 | B2* | 4/2015 | Yuasa | G03G 21/206 |
| | | | | 399/92 |
| 2003/0099094 | A1* | 5/2003 | Coles | H05K 7/1409 |
| | | | | 361/679.33 |
| 2004/0145881 | A1* | 7/2004 | Kosugi | F04D 29/703 |
| | | | | 361/810 |
| 2005/0139348 | A1* | 6/2005 | Lu | F04D 29/601 |
| | | | | 165/104.33 |
| 2012/0141265 | A1 | 6/2012 | Zhang et al. | |
| 2012/0230819 | A1* | 9/2012 | Chiu | F04D 25/0613 |
| | | | | 415/213.1 |
| 2013/0170896 | A1* | 7/2013 | Pang | G06F 1/183 |
| | | | | 403/292 |
| 2014/0205430 | A1 | 7/2014 | Chang et al. | |
| 2016/0298653 | A1* | 10/2016 | Masuo | F04D 19/002 |
| 2018/0045223 | A1* | 2/2018 | Bailey | F04D 29/668 |

\* cited by examiner

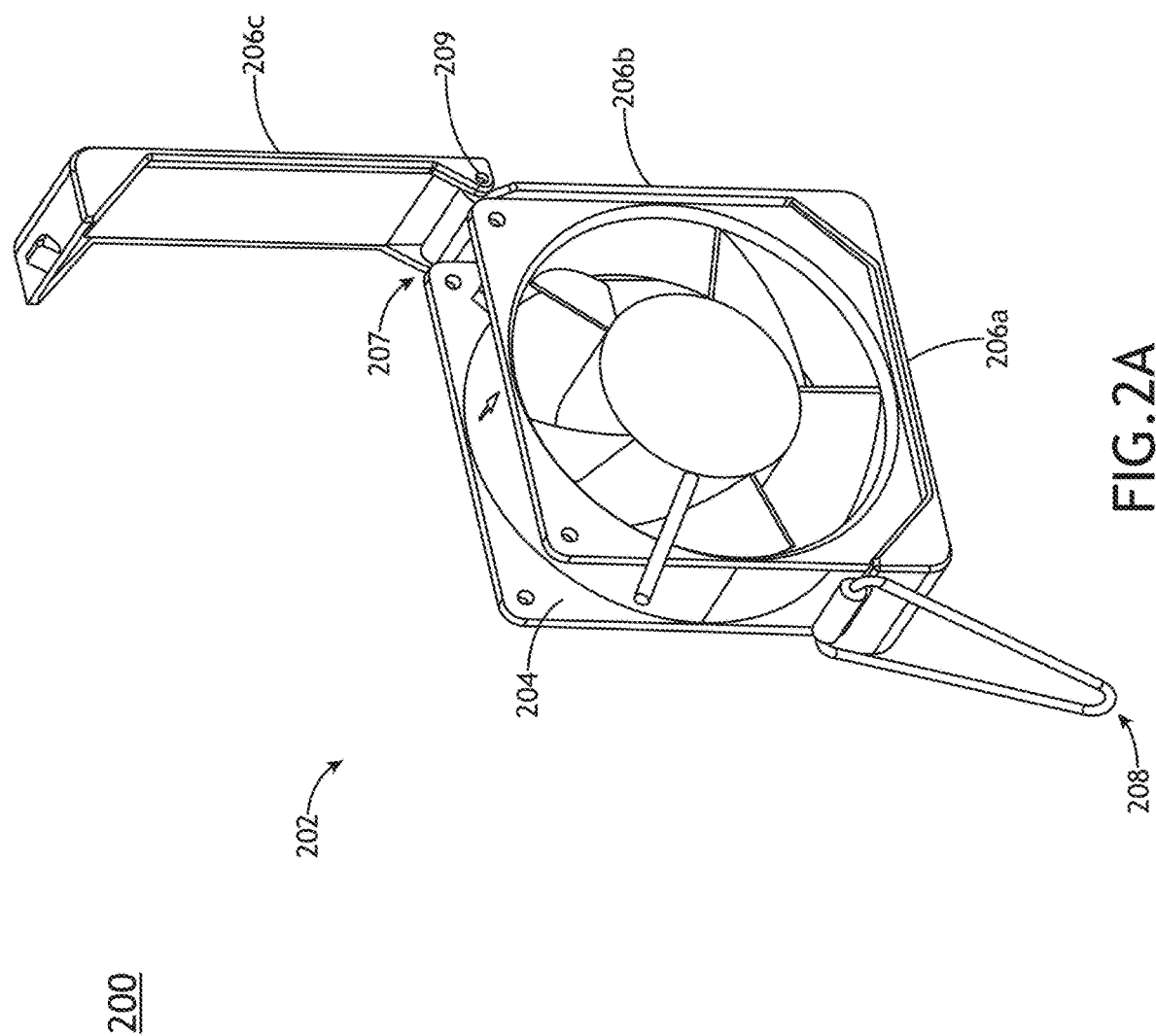

a# ACOUSTIC FAN CASING SYSTEM

CROSS-REFERENCE TO RELATED APPLICATIONS

The present disclosure claims the benefit of India Provisional Application No. 20/2311037771, filed Jun. 1, 2023, which is incorporated by reference in the entirety.

TECHNICAL FIELD

The present disclosure generally relates to the field of data centers, and more particularly to an acoustic fan casing system for a server rack cabinet.

BACKGROUND

Server racks often include fans to help manage the temperature of the server rack. However, such fans when in running condition, tend to vibrate which produces a vast amount of noise within the cabinet. Typically, the fans are mounted to a panel within the cabinet system using multiple pieces of hardware, which increase the cost and time for installation. As such, there is a need for a system which cures the shortfalls of the previous approaches identified above.

SUMMARY

An acoustic fan casing system is disclosed, in accordance with one or more embodiments of the present disclosure. In embodiments, the acoustic fan casing system includes a fan casing assembly configured to at least partially enclose one or more fans. In embodiments, the fan casing assembly includes one or more casing sidewalls configured to at least partially define a cavity configured to receive the one or more fans, where at least one casing sidewall of the one or more casing sidewalls are configured to rotate between one of an open position or a closed position via a rotation mechanism, where one or more surfaces of the one or more casing sidewalls are coupled to one or more acoustic insulation pads formed of one or more acoustic insulation materials to reduce vibrational noise. In embodiments, the fan casing assembly includes one or more sidewall fastening members configured to couple at least one casing sidewall of the one or more casing sidewalls to an additional at least one casing sidewall of the one or more casing sidewalls. In embodiments, the acoustic fan casing system includes a mounting assembly including one or more mounting members configured to removably couple the fan casing assembly to a panel of a cabinet.

An acoustic fan casing system is disclosed, in accordance with one or more embodiments of the present disclosure. In embodiments, the acoustic fan casing system includes a fan casing assembly configured to at least partially enclose one or more fans. In embodiments, the fan casing assembly includes one or more casing sidewalls configured to at least partially define a cavity configured to receive the one or more fans, where at least one casing sidewall of the one or more casing sidewalls are configured to rotate between one of an open position or closed position via a rotation mechanism, where one or more surfaces of the one or more casing sidewalls are coupled to one or more acoustic insulation pads formed of one or more acoustic insulation materials. In embodiments, the fan casing assembly includes one or more sidewall fastening members configured to couple at least one casing sidewall of the one or more casing sidewalls to an additional at least one casing sidewall of the one or more casing sidewalls.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures.

FIG. 2A is a simplified schematic view of an acoustic fan casing system including a fan, in accordance with one or more embodiments of the present disclosure.

FIG. 2I is rear exploded view of an acoustic fan casing system including a fan, in accordance with one or more embodiments of the present disclosure.

DETAILED DESCRIPTION

Reference will now be made in detail to the subject matter disclosed, which is illustrated in the accompanying drawings.

Figure 1:
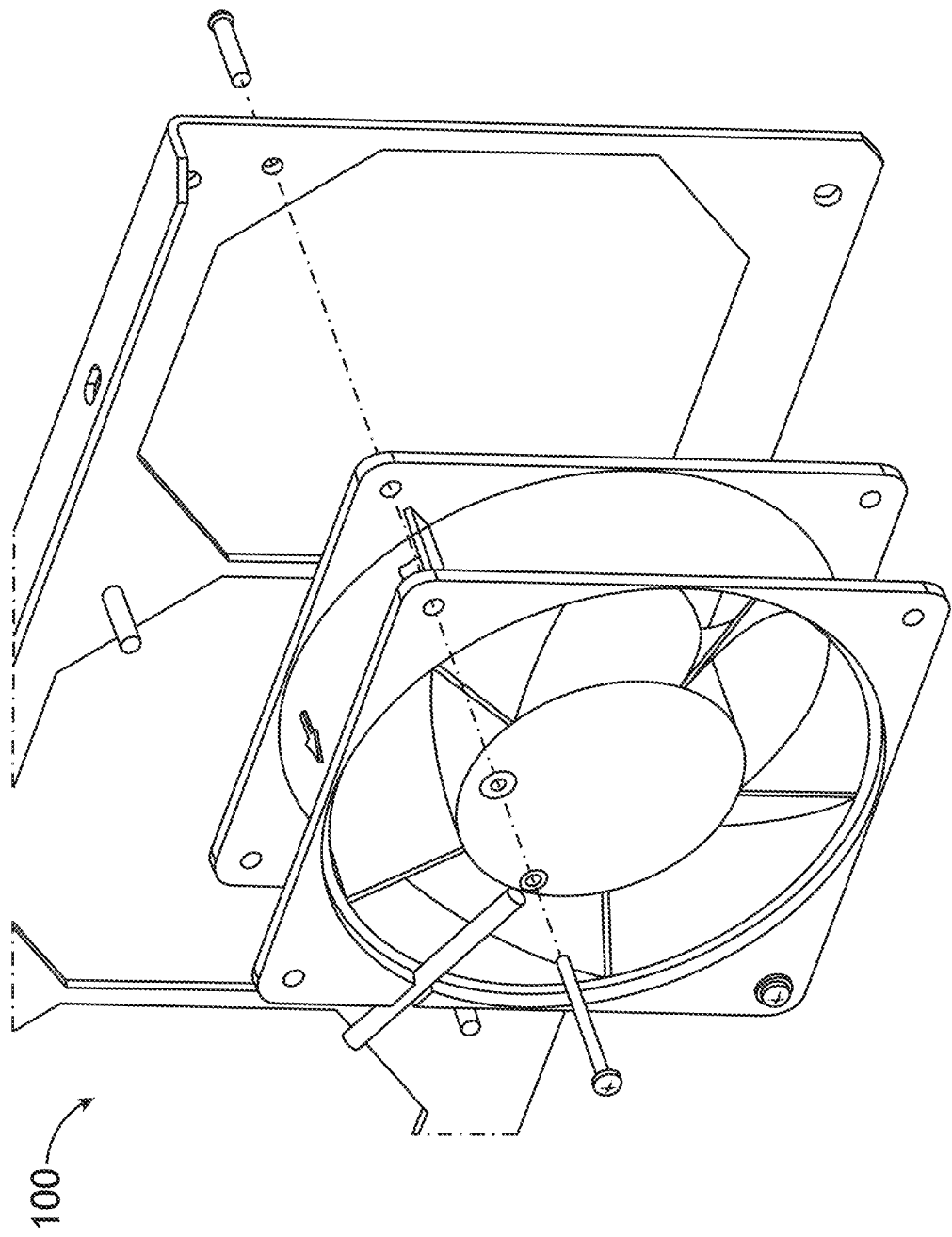
FIG. 1 is a simplified schematic view of a conventional fan mounting assembly.

Server racks often include fans to help manage the temperature of the server rack. However, such fans when in running condition, tend to vibrate which produces a vast amount of noise within the cabinet. Typically, the fans are mounted to a panel within the cabinet system using multiple pieces of hardware. For example, as shown in FIG. 1, conventional fan assemblies 100 are directly mounted to the cabinet via a conventional mounting assembly (e.g., flat washer, lock washer, screw, studs, and the like). The direct mounting and associated mounting hardware increases the cost and time for installation.

Accordingly, the present disclosure is directed to an acoustic fan casing system. More particularly, the present disclosure is directed to an acoustic fan casing system including a fan casing assembly with integrated acoustic material to reduce noise. For example, the fan casing assembly may be configured to at least partially enclose one or more perimeter edges of a fan, where at least a portion of the fan casing assembly is integrated with an acoustic material to reduce noise caused by the enclosed fan. Further, the fan casing assembly may secure to the fan and be removably mounted to a panel of a cabinet. In this regard, fan replacement may be done during maintenance without use of any tools.

Referring to FIGS. 2A-6, an acoustic fan casing system 200 of the present disclosure is shown. For purposes of the present disclosure, the term "acoustic fan casing system 200", "fan casing system 200", "casing system 200", "system 200", and variations thereof may be considered equivalent, unless otherwise noted herein.

The system 200 may include a fan casing assembly 202 configured to at least partially enclose one or more fans 204.

Figure 2B:
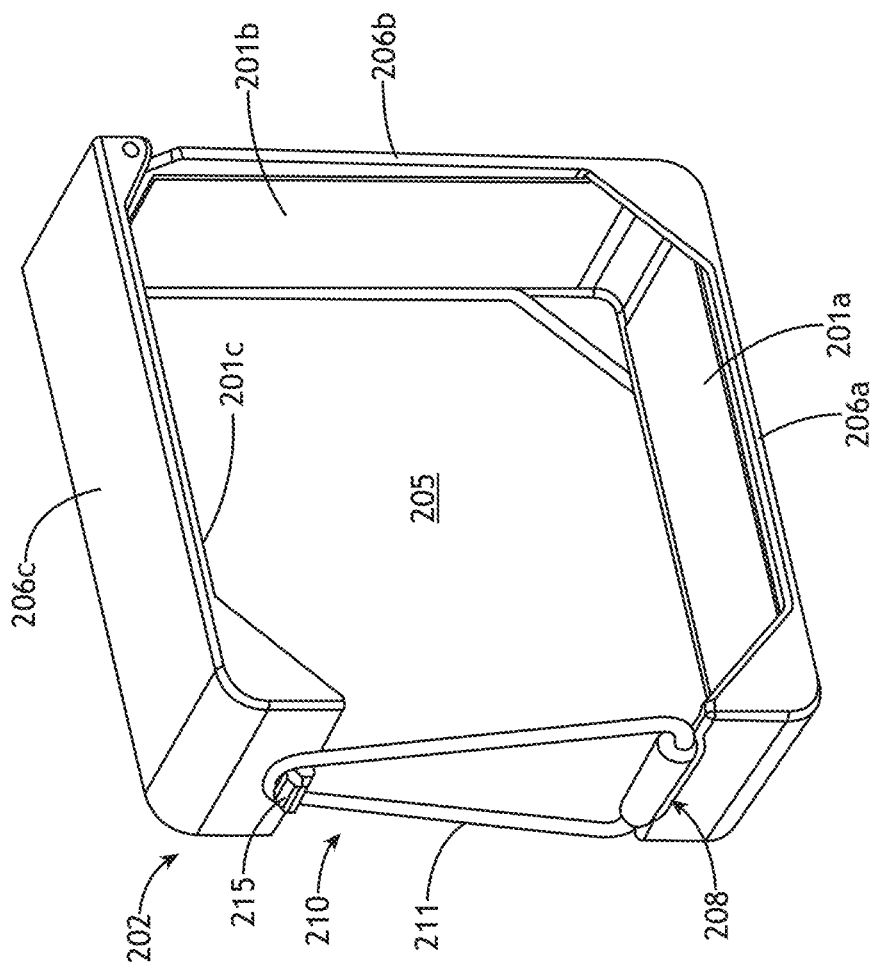
FIG. 2B is a simplified schematic view of an acoustic fan casing system, in accordance with one or more embodiments of the present disclosure.
Figure 2C:
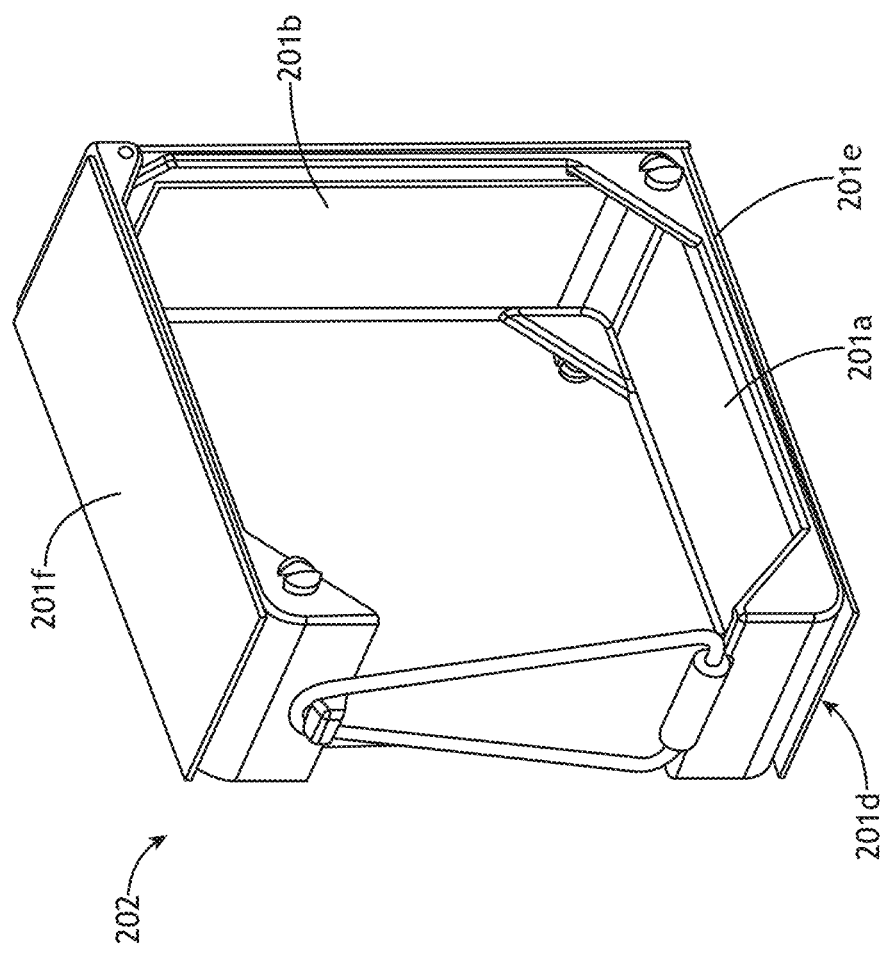
FIG. 2C is a simplified schematic view of an acoustic fan casing system, in accordance with one or more embodiments of the present disclosure.
Figure 2D:
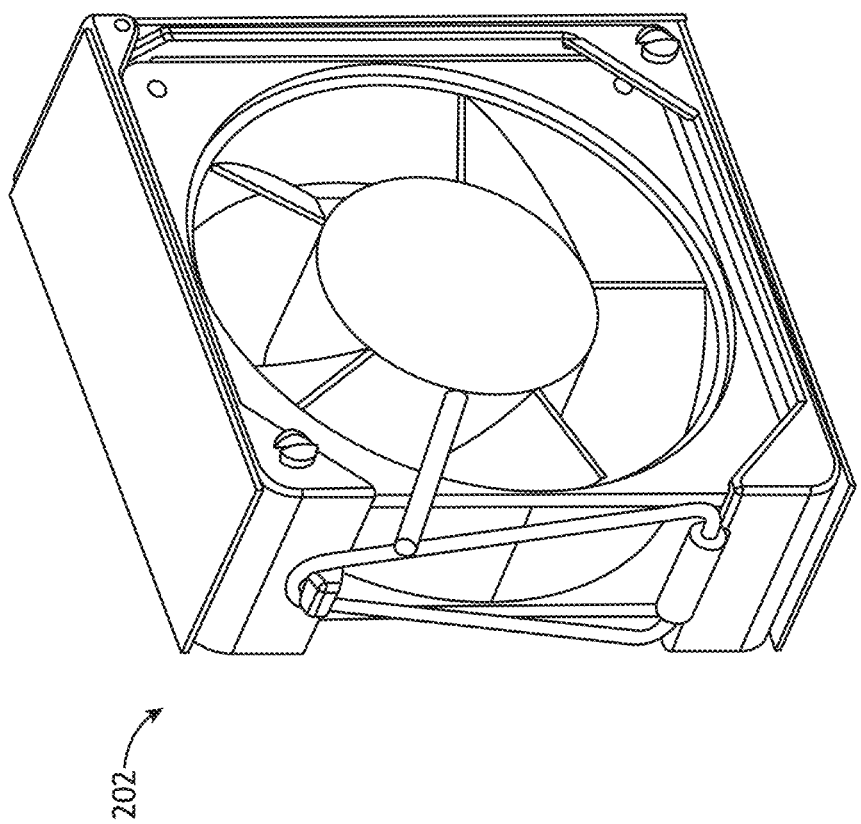
FIG. 2D is a simplified schematic view of an acoustic fan casing system including a fan, in accordance with one or more embodiments of the present disclosure.
Figure 2E:
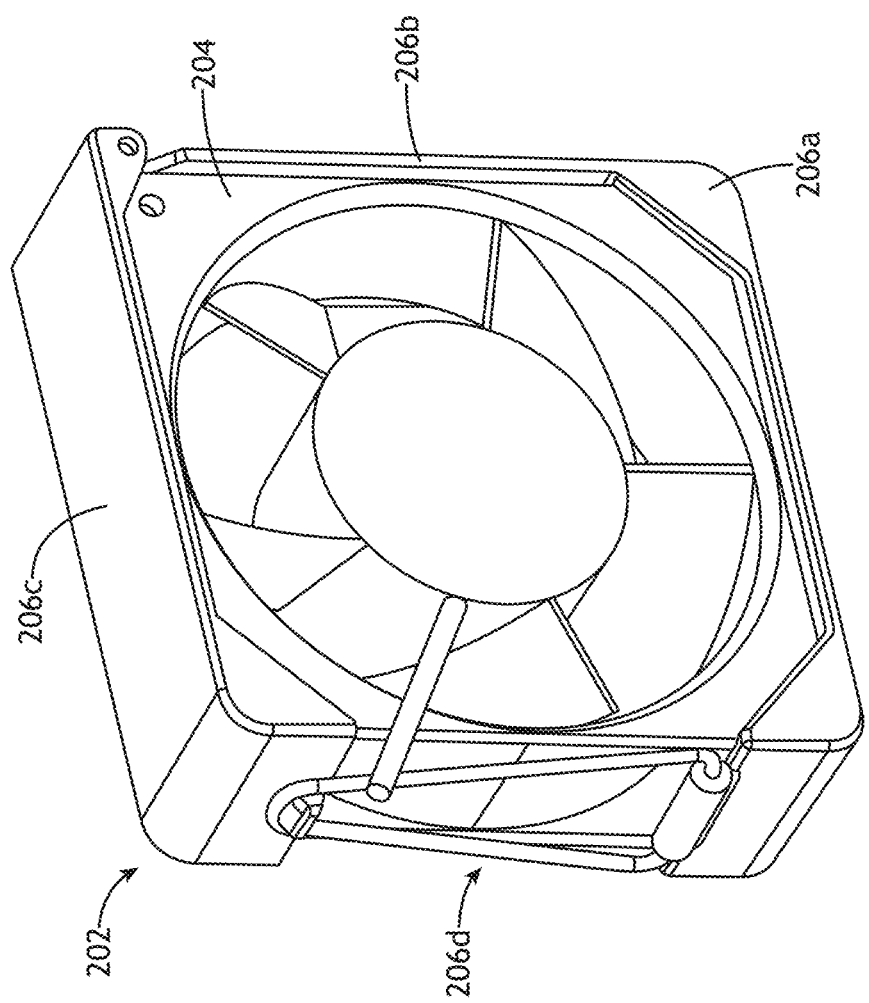
FIG. 2E is a simplified schematic view of an acoustic fan casing system including a fan, in accordance with one or more embodiments of the present disclosure.
Figure 2F:
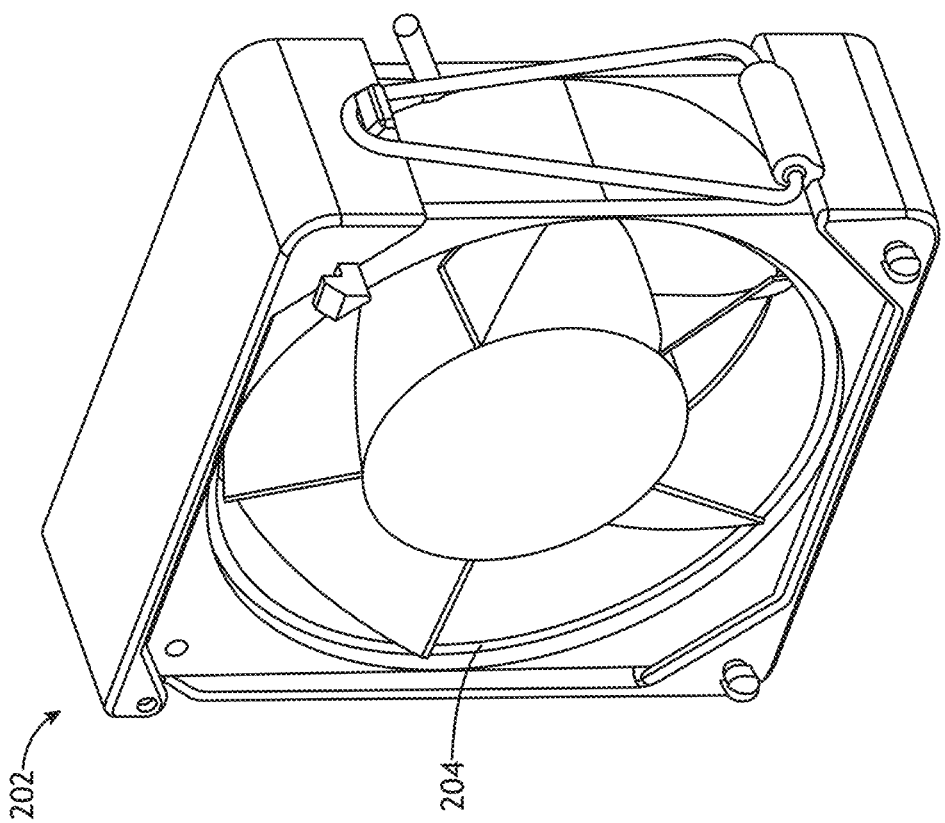
FIG. 2F is a simplified schematic view of an acoustic fan casing system including a fan, in accordance with one or more embodiments of the present disclosure.
Figure 2G:
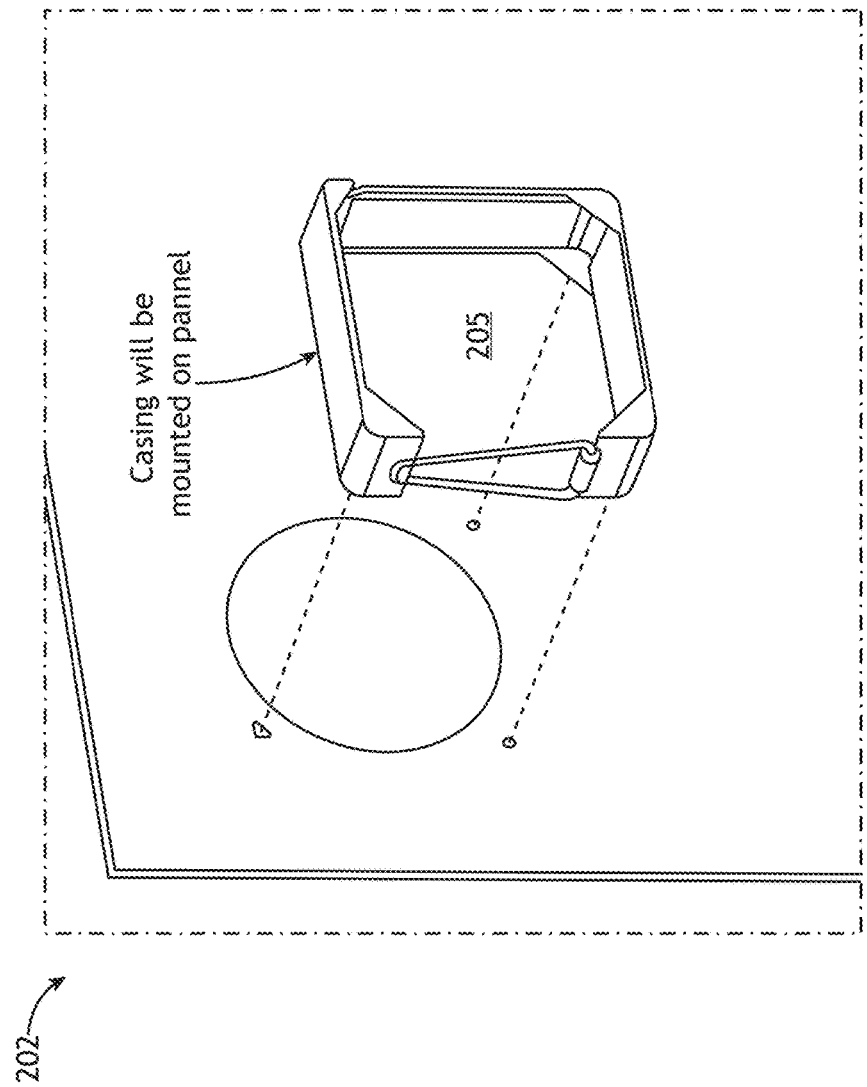
FIG. 2G is a simplified schematic view of an acoustic fan casing system, in accordance with one or more embodiments of the present disclosure.

The fan casing assembly 202 may include one or more casing sidewalls. For example, the fan casing assembly 202 may include a first casing sidewall 206a, a second casing sidewall 206b, a third casing sidewall 206c, up to an N number of casing sidewalls. In one instance, as shown in FIGS. 2A-2D, the fan casing assembly 202 may include a bottom casing sidewall 206a, a side casing sidewall 206b, and a top casing sidewall 206c. In another instance, as shown in FIGS. 2E-2F, the fan casing assembly 202 may include a bottom casing sidewall 206a, a side casing sidewall 206b, a top casing sidewall 206c, and an additional side casing sidewall 206d.

In some embodiments, the one or more casing sidewalls are integrated together. For example, as shown in at least FIG. 2A, the bottom casing sidewall 206a and the side casing sidewall 206b may be formed of a single piece and integrated together. Continuing with this example, the integrated bottom casing sidewall 206a and the side casing sidewall 206b may be coupled to the individual top casing sidewall 206c, such that the top casing sidewall 206c may be rotated between the open and closed position, as discussed further herein.

In some embodiments, the one or more casing sidewalls are individually coupled together. For example, the one or more casing sidewalls may be formed of individual pieces and individually coupled together. For instance, the bottom casing sidewall 206a, the side casing sidewall 206b, and the top casing sidewall 206c may be individually coupled together.

The one or more casing sidewalls may be formed of any rigid material suitable for partially enclosing the one or more fans 204. For example, the one or more casing sidewalls may be formed of a plastic material.

The one or more casing sidewalls may be integrated with one or more acoustic insulation materials. For example, an interior surface of the one or more sidewalls 206a-206c may include one or more acoustic insulation pads formed of the one or more acoustic insulation materials. For instance, the interior surface of the bottom casing sidewall 206a may include a first acoustic pad 201a, the interior surface of the side casing sidewall 206b may include a second acoustic pad 201b, and the interior surface of the top casing sidewall 206c may include a third acoustic pad 201c. In this regard, the one or more acoustic pads on the interior surfaces of the one or more casing sidewalls 206a-206c may reduce the noise caused by the running fan 204 within the cavity 205 of the fan casing assembly 202. By way of another example, as shown in FIGS. 2C-2D, an exterior surface of the one or more sidewalls 206a-206c may be coupled to one or more acoustic pads. For instance, the exterior surface of the bottom casing sidewall 206a may include an acoustic pad 201d, the exterior surface of the side casing sidewall 206b may include an acoustic pad 201e, and an exterior surface of the top casing sidewall 206c may include an acoustic pad 201f. In this regard, the one or more acoustic pads on the exterior surfaces of the one or more casing sidewalls 206a-206c may reduce the noise caused by the running fan 204 within the cavity 205 of the fan casing assembly 202.

It is noted that the configuration of acoustic pads shown in FIGS. 2A-2D are provided merely for illustrative purposes. The fan casing assembly 202 may include any number and configuration of acoustic pads coupled to (or integrated with) the one or more sidewall casings.

The one or more acoustic pads may include any acoustic material suitable for reducing vibrational noise caused by the fan 204 (or mounting of the assembly to the panel). For example, the acoustic material may include, but is not limited to, polyurethane, or the like.

In a non-limiting example, the acoustic pad may have an insulation with a Noise Reduction Coefficient (NRC) greater than approximately 0.8 and a thickness between approximately 10 mm and 12 mm.

The one or more acoustic insulation materials may be coupled to the one or more casing sidewalls 206a-206c via any fastening mechanism including, but not limited to, one or more adhesives (e.g., polyurethane adhesives), and the like.

The fan casing assembly 202 may include one or more sidewall fastening members 208. For example, the one or more sidewall fastening members 208 may be configured to at least partially couple together one or more of the one or more casing sidewalls. For instance, as shown in FIG. 2B, the first casing sidewall 206a may be removably coupled to the third casing sidewall 206c via the one or more sidewall fastening members 208.

Referring to FIGS. 2A-2H, the one or more sidewall fastening members 208 may include a triangular ring-and-hook sub-assembly 210. For example, the assembly may include a triangular ring 211 coupled to the first casing sidewall 206a and a hook 215 coupled to the third casing sidewall 206c. For instance, when fastened together, the triangular ring 211 and the hook 215 may form a fourth casing sidewall 206d. When unfastened, the triangular ring 211 may rotate about an axis, such that the top casing 206c may rotate to the open position to install/remove the fan 204.

Figure 3A:
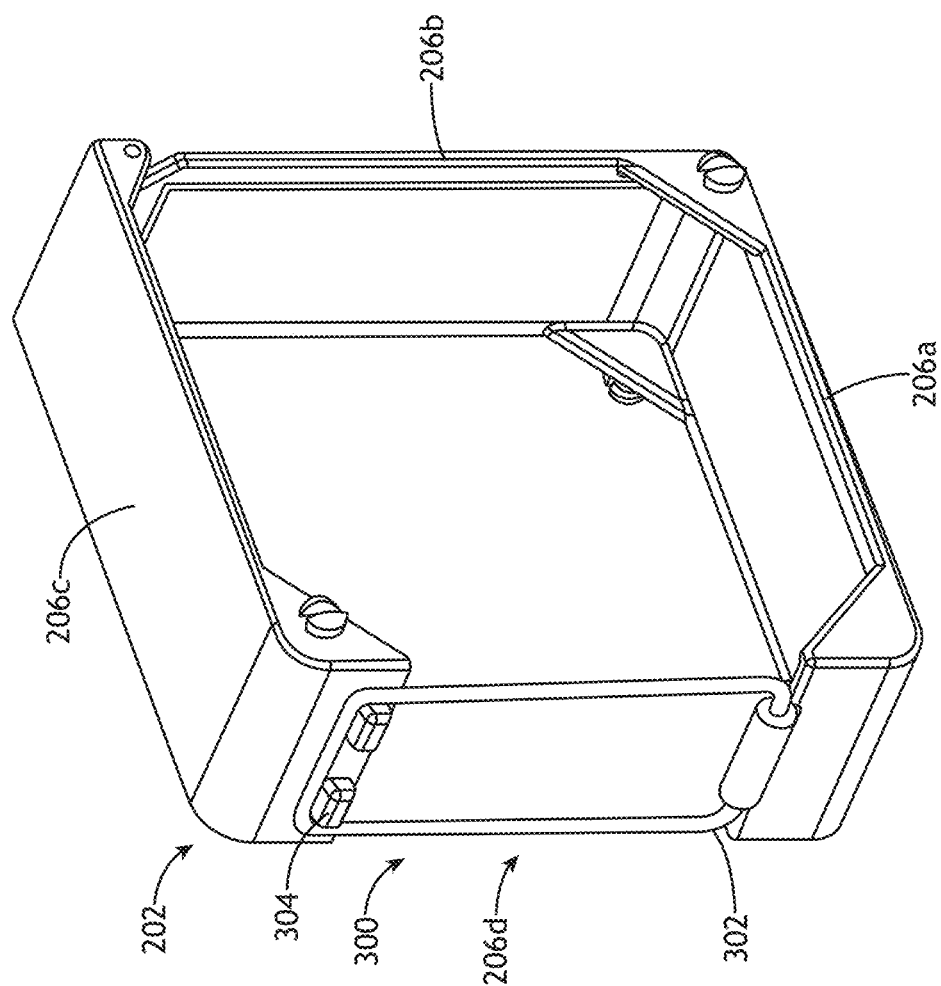
FIG. 3A is a simplified schematic view of an acoustic fan casing system, in accordance with one or more embodiments of the present disclosure.
Figure 3B:
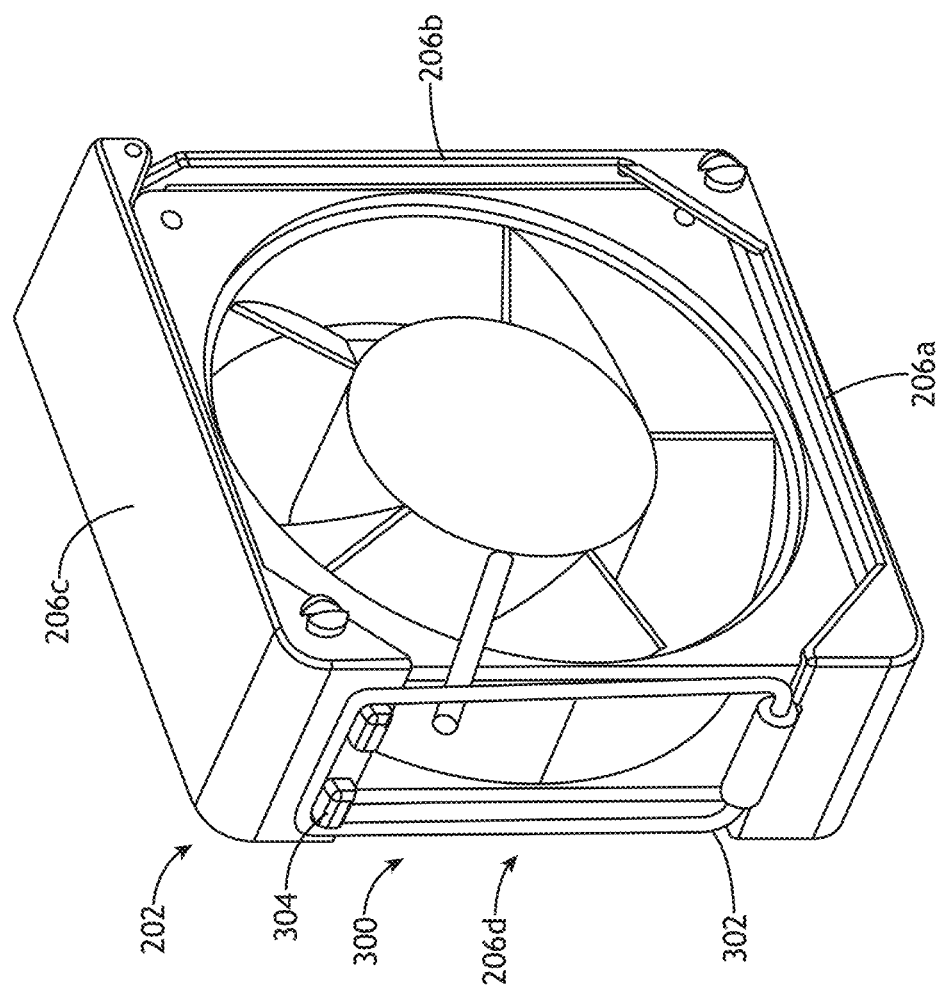
FIG. 3B is a simplified schematic view of an acoustic fan casing system including a fan, in accordance with one or more embodiments of the present disclosure.

Referring to FIGS. 3A-3B, the one or more sidewall fastening members 208 may include a rectangular ring-and-hook sub-assembly 300. For example, the sub-assembly 300 may include a rectangular ring 302 coupled to the first casing sidewall 206a and one or more hooks 304 coupled to the third casing sidewall 206c. For instance, when fastened together, the rectangular ring 302 and the one or more hooks 304 may form a fourth casing sidewall 206d. When unfastened, the rectangular ring 302 may rotate about an axis, such that the top casing 206c may rotate to the open position to install/remove the fan 204.

Although FIGS. 2A-3B depict a triangular and rectangular ring, respectfully, it is noted that the sub-assemblies may include any shaped ring and any configuration of hooks 215, 304.

Figure 4A:
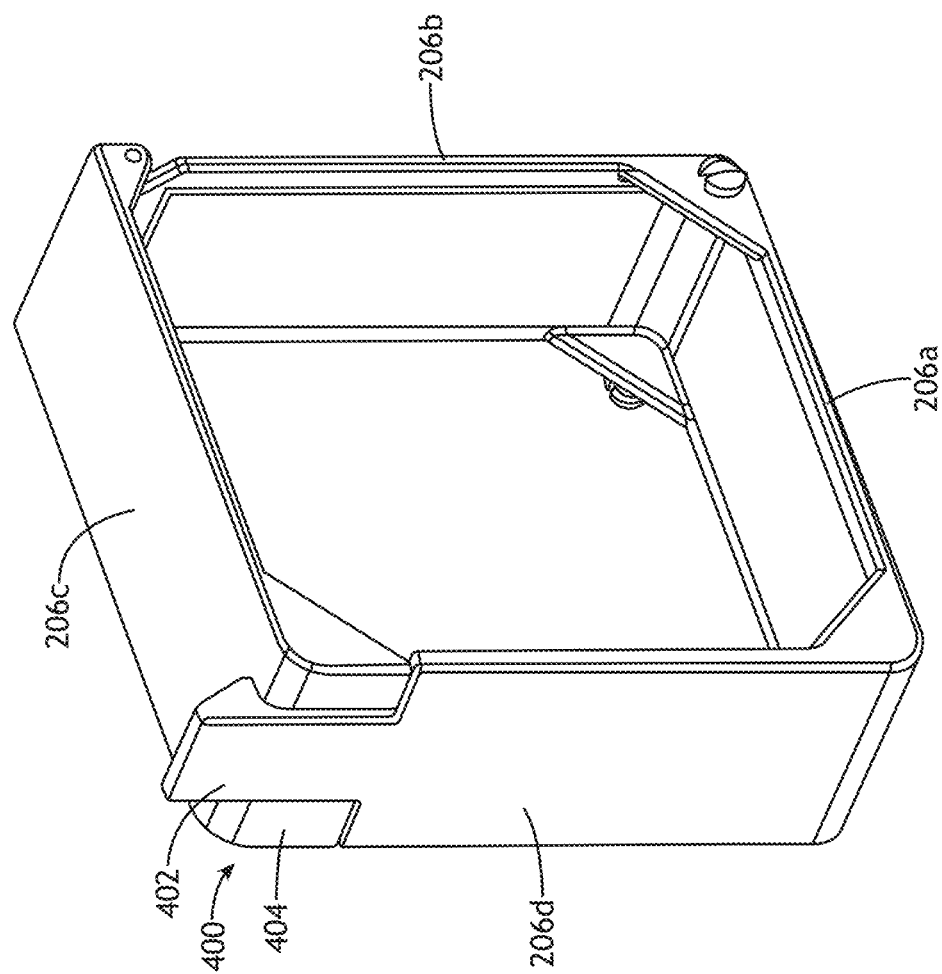
FIG. 4A is a simplified schematic view of an acoustic fan casing system, in accordance with one or more embodiments of the present disclosure.
Figure 4B:
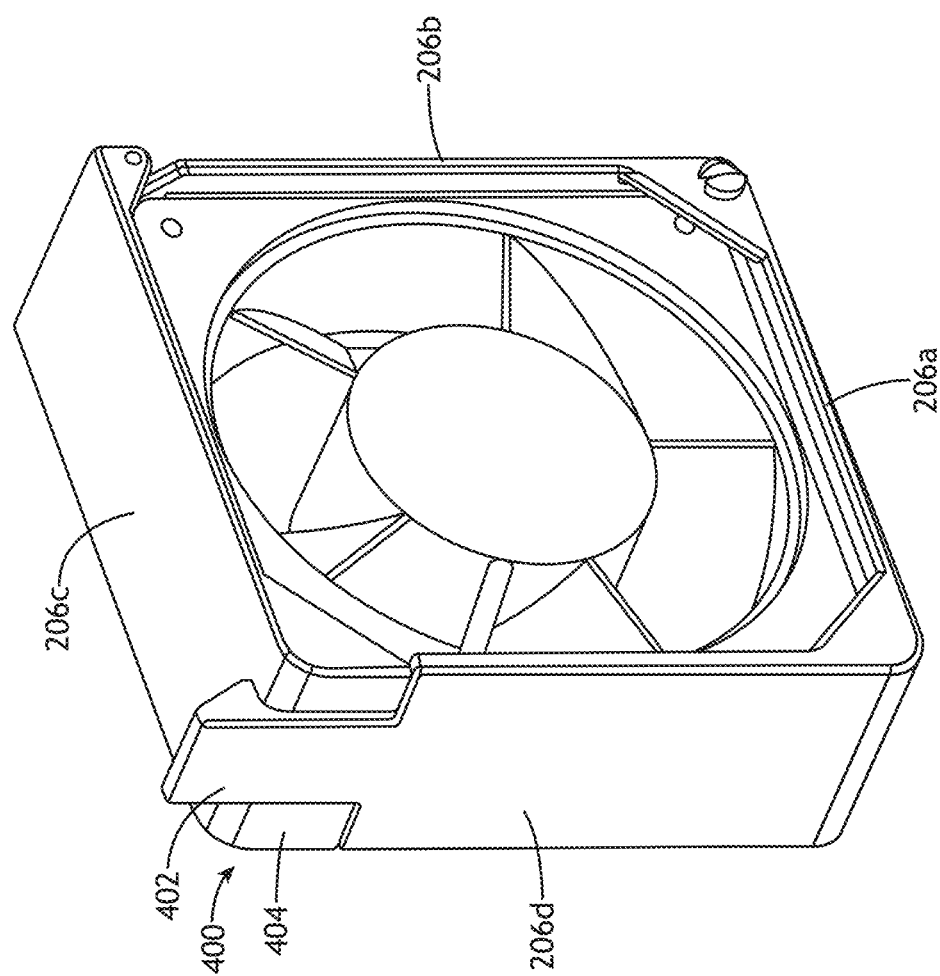
FIG. 4B is a simplified schematic view of an acoustic fan casing system including a fan, in accordance with one or more embodiments of the present disclosure.

Referring to FIGS. 4A-4B, the one or more sidewall fastening members 208 may include a tab-and-groove sub-assembly 400. For example, the tab-and-groove sub-assembly 400 may include a one or more tabs 402 formed on the fourth casing sidewall 206d and one or more grooves 404 formed on the third casing sidewall 206c. For instance, the one or more grooves 404 on the third casing sidewall 206c may correspond to the one or more tabs 402 on the fourth casing sidewall 206d, such that when they are coupled, the one or more tabs 402 may be interference fitted within the one or more corresponding grooves 404.

The one or more casing sidewalls may at least partially define a cavity 205 configured to receive the fan 204. For example, when coupled together via the one or more sidewall fastening members 208, the one or more casing sidewalls may at least partially enclose the one or more perimeter edges of the fan 204 within the cavity 205.

Figure 2H:
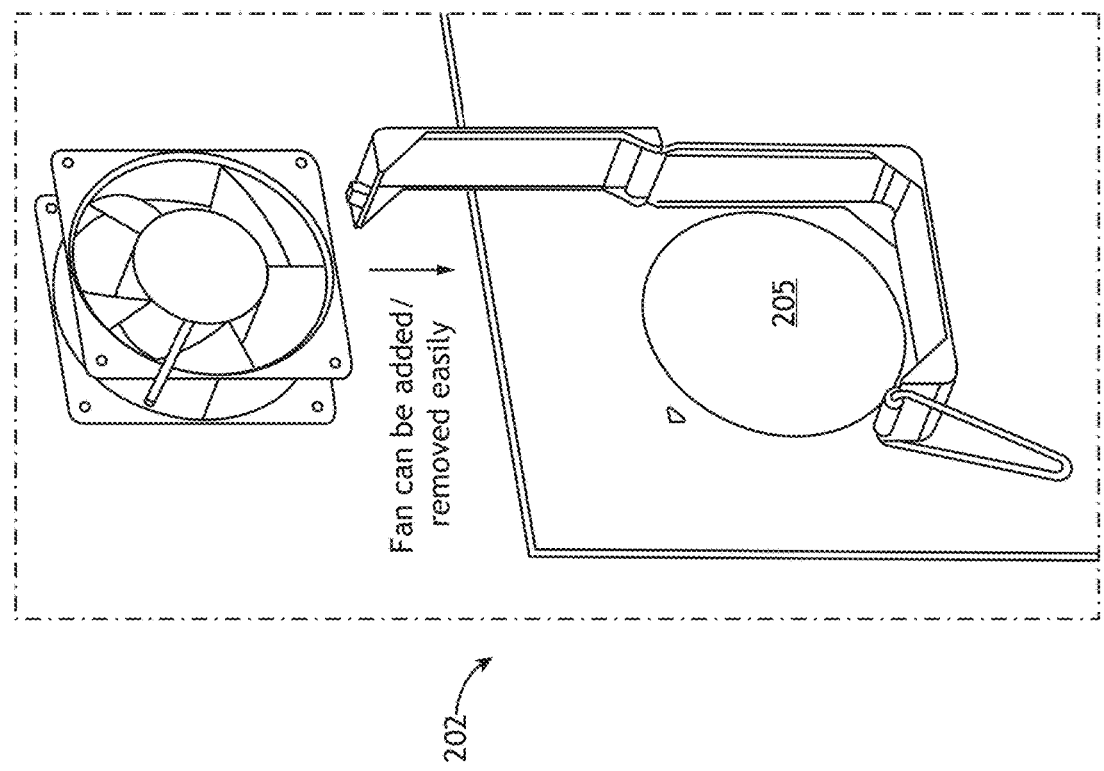
FIG. 2H is a simplified schematic view of an acoustic fan casing system, in accordance with one or more embodiments of the present disclosure.
Figure 21:
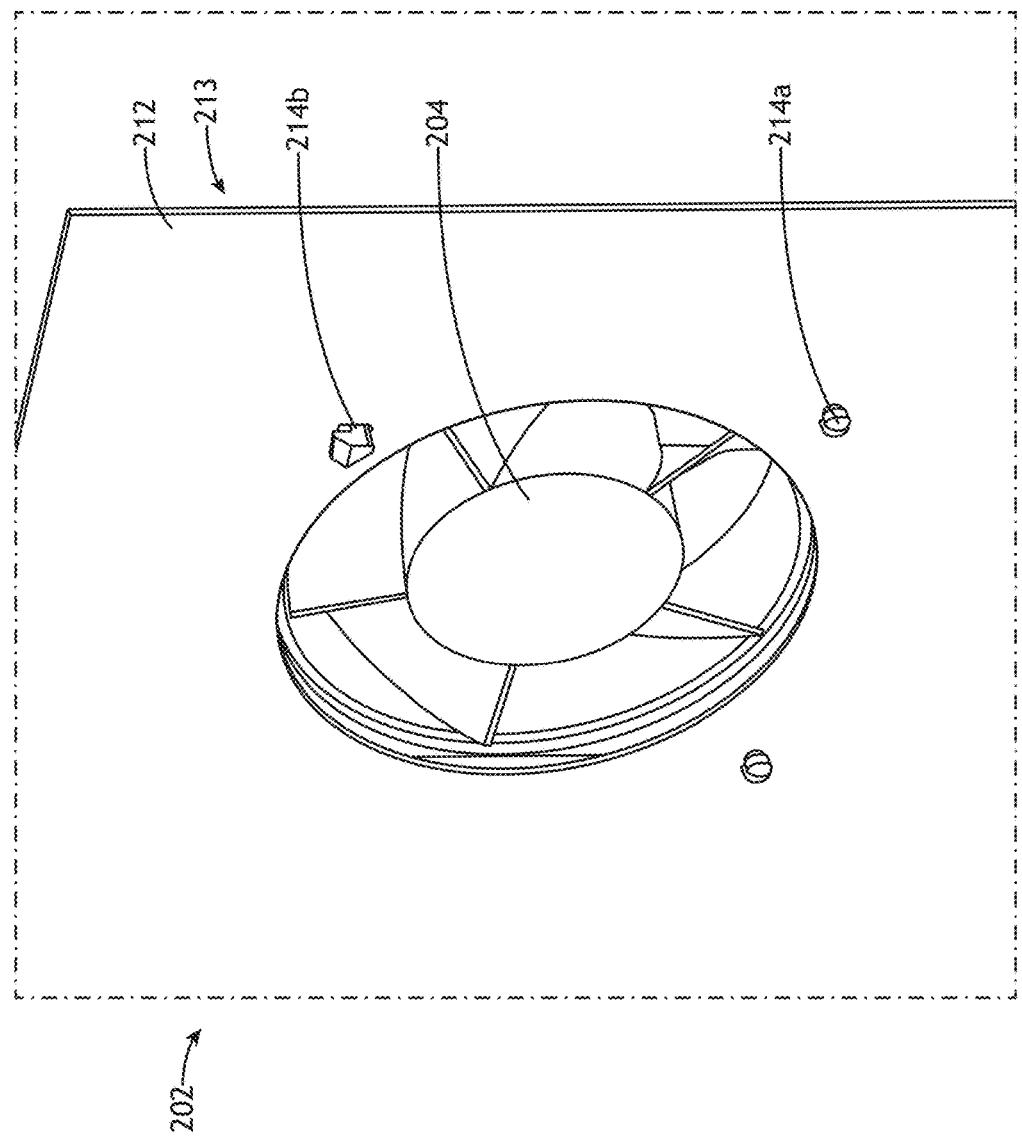
Figure 2J:
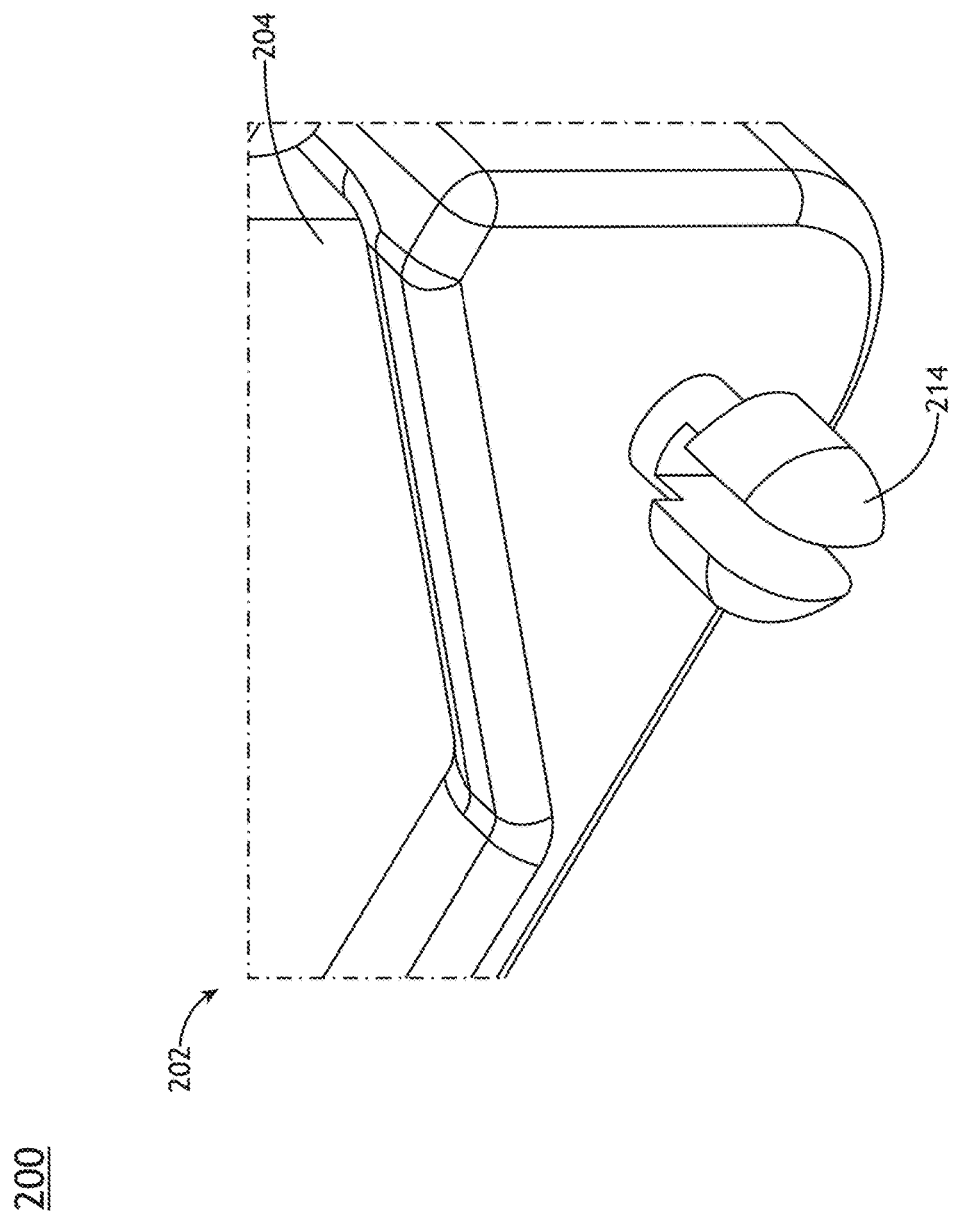
FIG. 2J is an exploded view of one or more mounting members of an acoustic fan casing system, in accordance with one or more embodiments of the present disclosure.

The third casing sidewall 206c and the second casing sidewall 206b may be rotatably coupled together via a hinge mechanism 207. For example, the top casing sidewall 206c may be configured to rotate about an axis along a hinge pin 209 of the hinge mechanism 207. For instance, as shown in FIG. 2H, when the sidewall fastening member 208 is unfastened, the top casing sidewall 206c may rotate about the axis along the hinge pin 209, such that the fan 204 may be installed within the cavity 205 (or removed from the cavity 205). Although FIG. 2H depicts the top casing 206c being rotatably coupled to the side casing 206b, it is noted that any of the casing sidewalls may be rotatably coupled together such that the fan 204 may be installed within the cavity 205 (or removed from the cavity 205).

The system 200 may further include a mounting assembly 213. For example, as shown in at least FIGS. 2I-2J, the fan casing assembly 202 may be configured to removably couple to a panel 212 of a cabinet via the mounting assembly 213.

The mounting assembly 213 may include one or more mounting members configured to removably couple to the panel 212 of the cabinet. For example, the one or more mounting members may include one or more snap-fit pins 214. For instance, the one or more snap-fit pins 214 may be configured to be removably coupled to the panel 212 of the cabinet via one or more corresponding holes (or grooves). As shown in FIG. 2I, the one or more snap-fit pins 214 may include a first set of pins 214a including one or more push-lock pins including one or more living hinges and a second set of pins 214b including one or more tab pins. It is noted that the one or more mounting members may include any configuration of interference fitted mounting members or like suitable for removably coupling the fan casing assembly 202 to the panel 212 of the cabinet.

Figure 5A:
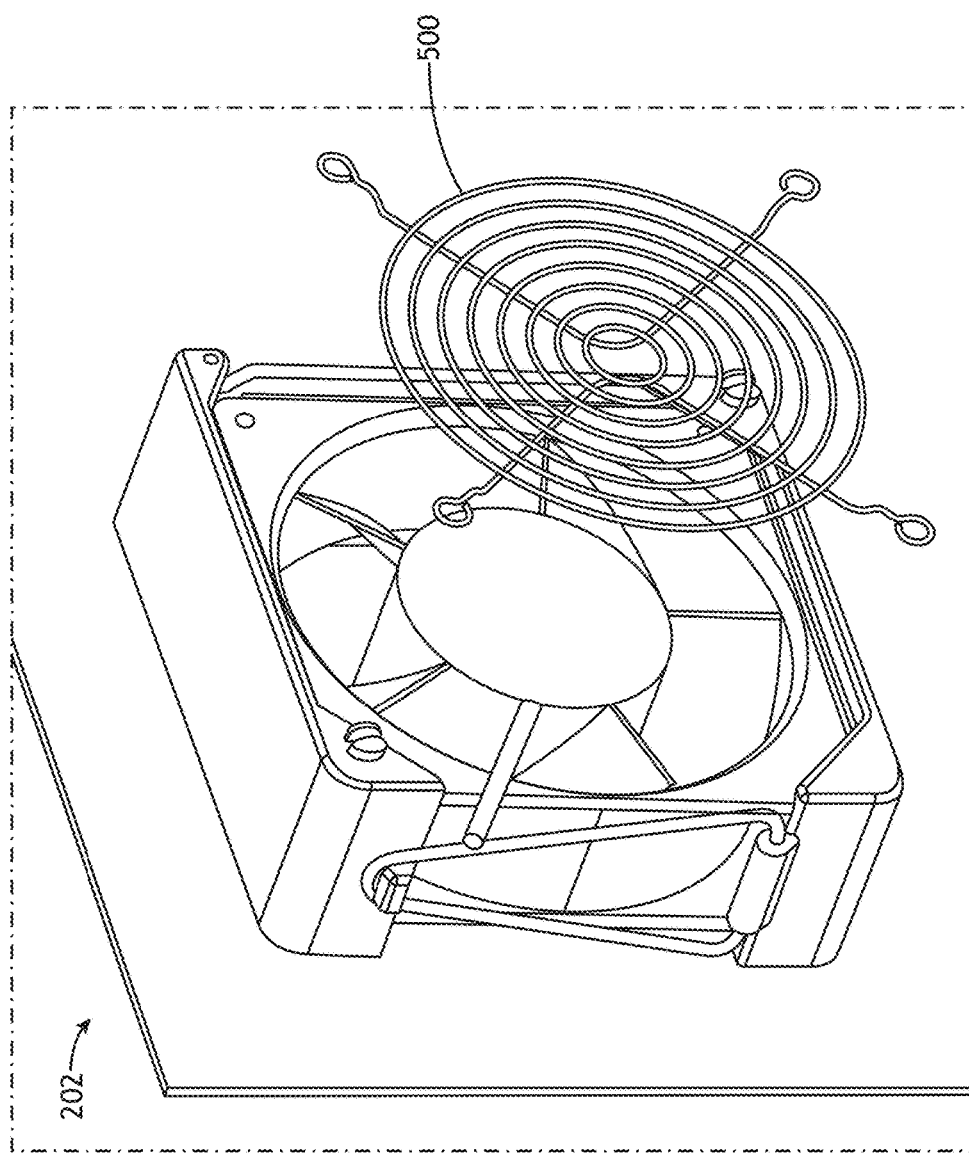
FIG. 5A is a simplified schematic view of an acoustic fan casing system including a fan and a finger guard, in accordance with one or more embodiments of the present disclosure.
Figure 5B:
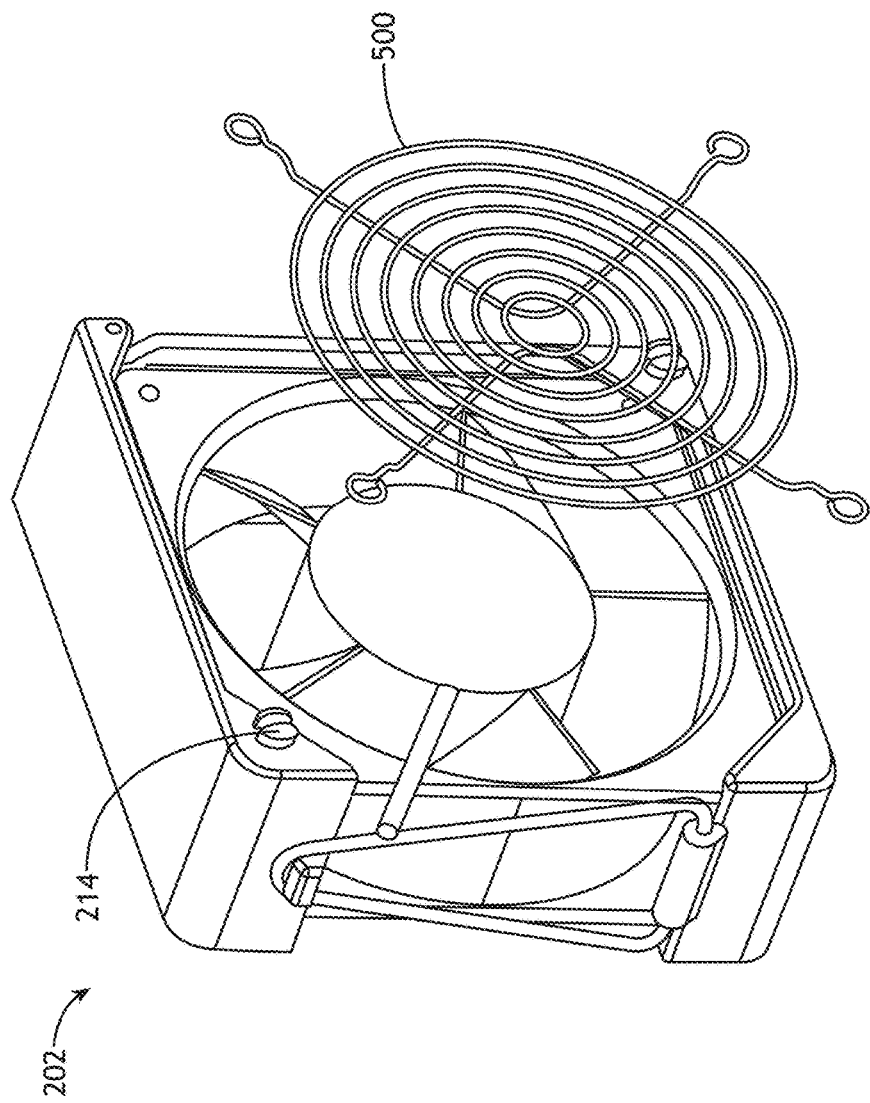
FIG. 5B is a simplified schematic view of an acoustic fan casing system including a fan and a finger guard, in accordance with one or more embodiments of the present disclosure.

Referring to FIGS. 5A-5B, the fan casing assembly 202 may include a finger guard 500 mounted on a front face of the fan casing assembly 202. For example, the finger guard 500 may be configured to couple to the one or more mounting members. For instance, the finger guard 500 may be configured to couple to one or more snap-fit pins 214 on the front face of the fan casing assembly 202.

Figure 6:
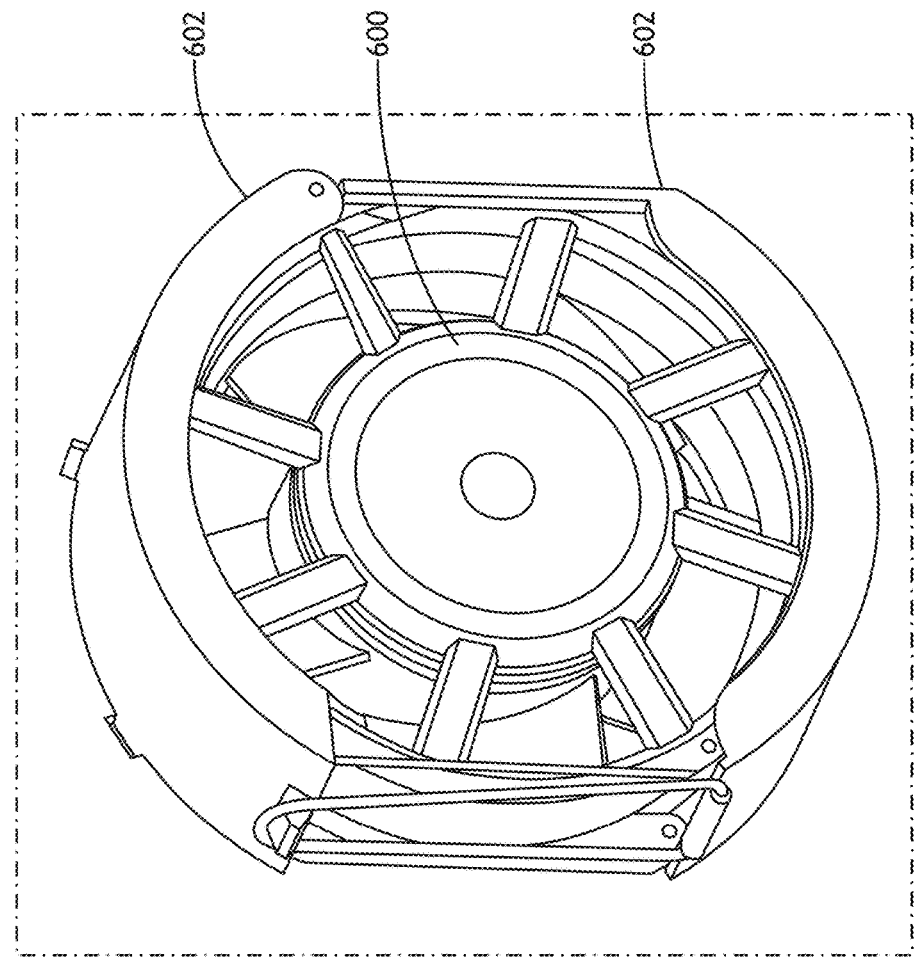
FIG. 6 is a simplified schematic view of an acoustic fan casing system including a fan, in accordance with one or more embodiments of the present disclosure.

Although FIGS. 2A-5B depict the fan casing assembly 202 including a square (or rectangular) shaped fan 204, it is noted that the fan casing assembly 202 may be adapted for any shaped fan. For example, as shown in FIG. 6, the fan casing assembly 202 may be configured to enclose a circular fan 600. In this embodiment, the one or more casing sidewalls may include one or more curved sidewalls 602.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed:

1. An acoustic fan casing system, the acoustic fan casing system comprising:
   a fan;
   a fan casing assembly configured to at least partially enclose the fan, the fan casing assembly comprising:
   a plurality of casing sidewalls configured to at least partially define a cavity configured to receive the fan, wherein an intake face of the fan and an exhaust face of the fan is exposed when installed in the cavity of the fan casing assembly, wherein the plurality of casing sidewalls includes at least a bottom casing sidewall, a side casing sidewall, and a top casing sidewall, wherein the bottom casing sidewall interfaces with a bottom of the fan, the side casing sidewall interfaces with a side of the fan, and the top casing sidewall interfaces with a top of the fan when the fan is installed in the cavity of the fan casing assembly, wherein at least one casing sidewall of the plurality of casing sidewalls is configured to rotate between one of an open position or a closed position via a rotation mechanism, wherein one or more surfaces of the plurality of casing sidewalls are coupled to one or more acoustic insulation pads formed of one or more acoustic insulation materials to reduce vibrational noise; and one or more sidewall fastening members configured to couple at least one casing sidewall of the plurality of casing sidewalls to an additional at least one casing sidewall of the plurality of casing sidewalls, wherein the bottom casing sidewall, the side casing sidewall, the top casing sidewall, and the one or more sidewall fastening members enclose one or more perimeter edges of the fan when installed in the cavity; and a mounting assembly including one or more mounting members arranged on at least one casing sidewall of the plurality of casing sidewalls, wherein the one or more mounting members are configured to removably couple the fan casing assembly to a panel of a cabinet.

2. The acoustic fan casing system of claim 1, wherein the rotation mechanism includes a hinge mechanism, the hinge mechanism including a hinge pin, wherein the at least one casing sidewall is configured to rotate about an axis of the hinge pin between one of the open position or the closed position via the hinge mechanism.

3. The acoustic fan casing system of claim 1, wherein the one or more sidewall fastening members include a ring-and-hook sub-assembly including at least a ring coupled to the at least casing sidewall and a hook coupled to the at least additional casing sidewall, wherein the ring is configured rotate about an axis.

4. The acoustic fan casing system of claim 3, wherein the ring includes at least one of a triangular ring or a rectangular ring.

5. The acoustic fan casing system of claim 1, wherein the one or more sidewall fastening members include a tab-and-groove sub-assembly including one or more tabs formed on the at least casing sidewall and one or more grooves formed on the at least additional casing sidewall, wherein the one or more tabs are interference fitted within the one or more grooves when coupled together.

6. The acoustic fan casing system of claim 1, wherein the one or more acoustic insulation pads are coupled to one or more interior surfaces of the plurality of casing sidewalls, wherein the one or more interior surfaces of the plurality of casing sidewalls are arranged inside the cavity of the fan casing assembly, wherein the one or more interior surfaces of the plurality of casing sidewalls abut a plurality of fan sidewalls of the fan when installed in the cavity of the fan casing assembly.

7. The acoustic fan casing system of claim 2, wherein the one or more acoustic insulation pads are coupled to one or more exterior surfaces of the plurality of casing sidewalls, wherein the one or more exterior surfaces of the plurality of casing sidewalls are outside the cavity of the fan casing assembly.

8. The acoustic fan casing system of claim 1, wherein the one or more acoustic insulation pads are coupled to one or more exterior surfaces of the plurality of casing sidewalls, wherein the one or more exterior surfaces of the plurality of casing sidewalls are outside the cavity of the fan casing assembly.

9. The acoustic fan casing system of claim 1, wherein the one or more mounting members of the mounting assembly include one or more snap-fit pins configured to removably couple to one or more corresponding holes on the panel of the cabinet.

10. The acoustic fan casing system of claim 9, wherein the one or more snap-fit pins include one or more push-lock pins, wherein the one or more push-lock pins include one or more living hinges.

11. The acoustic fan casing system of claim 9, wherein the one or more snap-fit pins include one or more tab pins.

12. An acoustic fan casing system, the acoustic fan casing system comprising:

a fan casing assembly configured to at least partially enclose one or more fans, the fan casing assembly comprising:

a plurality of casing sidewalls configured to at least partially define a cavity configured to receive the one or more fans, wherein the plurality of casing sidewalls includes at least a bottom casing sidewall, a side casing sidewall, and a top casing sidewall, wherein the bottom casing sidewall interfaces with a bottom of the one or more fans, the side casing sidewall interfaces with a side of the one or more fans, and the top casing sidewall interfaces with a top of the one or more fans when the one or more fans are installed in the cavity of the fan casing assembly, wherein at least one casing sidewall of the plurality of casing sidewalls is configured to rotate between one of an open position or closed position via a rotation mechanism, wherein one or more surfaces of the plurality of casing sidewalls are coupled to one or more acoustic insulation pads formed of one or more acoustic insulation materials; and one or more sidewall fastening members configured to couple at least one casing sidewall of the plurality of casing sidewalls to an additional at least one casing sidewall of the plurality of casing sidewalls, wherein the bottom casing sidewall, the side casing sidewall, the top casing sidewall, and the one or more sidewall fastening members enclose one or more perimeter edges of the one or more fans when installed in the cavity.

13. The acoustic fan casing system of claim 12, further comprising:

a mounting assembly including one or more mounting members arranged on at least one casing sidewall of the plurality of casing sidewalls, wherein the one or more mounting members are configured to removably couple the fan casing assembly to a panel of a cabinet.

14. The acoustic fan casing system of claim 12, wherein the rotation mechanism includes a hinge mechanism, the hinge mechanism including a hinge pin, wherein the at least one casing sidewall is configured to rotate about an axis of the hinge pin between one of the open position or the closed position via the hinge mechanism.

15. The acoustic fan casing system of claim 12, wherein the one or more sidewall fastening members include a ring-and-hook sub-assembly including at least a ring coupled to the at least casing sidewall and a hook coupled to the at least additional casing sidewall, wherein the ring is configured rotate about an axis.

16. The acoustic fan casing system of claim 15, wherein the ring includes at least one of a triangular ring or a rectangular ring.

17. The acoustic fan casing system of claim 12, wherein the one or more sidewall fastening members include a tab-and-groove sub-assembly including one or more tabs formed on the at least casing sidewall and one or more grooves formed on the at least additional casing sidewall, wherein the one or more tabs are interference fitted within the one or more grooves when coupled together.

18. The acoustic fan casing system of claim 12, wherein the one or more acoustic insulation pads are coupled to one or more interior surfaces of the plurality of casing sidewalls, wherein the one or more interior surfaces of the plurality of casing sidewalls are arranged inside the cavity of the fan casing assembly, wherein the one or more interior surfaces of the plurality of casing sidewalls abut a plurality of fan sidewalls of the one or more fans when installed in the cavity of the fan casing assembly.

19. The acoustic fan casing system of claim 12, wherein the one or more acoustic insulation pads are coupled to one or more exterior surfaces of the plurality of casing sidewalls, wherein the one or more exterior surfaces of the plurality of casing sidewalls are outside the cavity of the fan casing assembly.

20. A system comprising:
a fan; and
a fan casing assembly configured to at least partially enclose the fan, the fan casing assembly comprising:
a plurality of casing sidewalls configured to at least partially define a cavity configured to receive the fan, wherein an intake face of the fan and an exhaust face of the fan is exposed when installed in the cavity of the fan casing assembly, wherein the plurality of casing sidewalls includes a bottom casing sidewall, a side casing sidewall, and a top casing sidewall, wherein the bottom casing sidewall interfaces with a bottom of the fan, the side casing sidewall interfaces with a side of the fan, and the top casing sidewall interfaces with a top of the fan when the fan is installed in the cavity of the fan casing assembly, wherein at least one casing sidewall of the plurality of casing sidewalls is configured to rotate between one of an open position or a closed position via a rotation mechanism, wherein one or more surfaces of the plurality of casing sidewalls are coupled to one or more acoustic insulation pads formed of one or more acoustic insulation materials to reduce vibrational noise; and
one or more sidewall fastening members configured to couple at least one casing sidewall of the plurality of casing sidewalls to an additional at least one casing sidewall of the plurality of casing sidewalls.

* * * * *